United States Patent
Kartäusch et al.

(10) Patent No.: US 11,112,480 B2
(45) Date of Patent: Sep. 7, 2021

(54) COMPRESSED SENSING WITH REGULARIZATION PARAMETER

(71) Applicant: Siemens Healthcare GmbH, Erlangen (DE)

(72) Inventors: Ralf Kartäusch, Bubenreuth (DE); Dominik Paul, Bubenreuth (DE); Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/923,669

(22) Filed: Jul. 8, 2020

(65) Prior Publication Data
US 2021/0025957 A1    Jan. 28, 2021

(30) Foreign Application Priority Data
Jul. 24, 2019 (EP) ..................... 19188049

(51) Int. Cl.
*G01R 33/561* (2006.01)
*G01R 33/44* (2006.01)
*G01R 33/56* (2006.01)

(52) U.S. Cl.
CPC ......... *G01R 33/561* (2013.01); *G01R 33/443* (2013.01); *G01R 33/5608* (2013.01)

(58) Field of Classification Search
USPC ....................................................... 324/309
See application file for complete search history.

(56) References Cited

U.S. PATENT DOCUMENTS

| 2015/0302616 A1* | 10/2015 | Haung | G06T 11/008 382/131 |
| 2016/0124064 A1* | 5/2016 | de Weerdt | G01R 33/5616 324/309 |

(Continued)

FOREIGN PATENT DOCUMENTS

CN    103064046 B    4/2015

OTHER PUBLICATIONS

Blasche, Mathias, Christoph Forman, and Siemens Healthineers. "Compressed sensing—the flowchart." MAGNETOM Flash 14. vol. 66. 2016. pp. 1-4. www.siemens.com/magnetom-world.

(Continued)

*Primary Examiner* — Rodney E Fuller
(74) *Attorney, Agent, or Firm* — Lempia Summerfield Katz LLC

(57) ABSTRACT

A method is provided for generating a signal-to-noise improved magnetic resonance (MR) image of an object under examination in an MR system using a compressed sensing technology. The method includes determining a first MR signal data set of the object under examination in which a corresponding k-space is randomly subsampled; determining a location dependent sensitivity map for each of at least one receiving coil used to detect MR signals of the first MR signal data set in the location where the object under examination is located; and determining the MR image using an optimization process of the compressed sensing technology in which a location dependent regularization parameter is used, wherein the location dependent regularization parameter is determined based on the location dependent sensitivity map.

15 Claims, 2 Drawing Sheets

(56) References Cited

U.S. PATENT DOCUMENTS

| | | | |
|---|---|---|---|
| 2016/0187446 A1 | 6/2016 | Zhou | |
| 2018/0356484 A1* | 12/2018 | Boernert | G01R 33/56509 |
| 2020/0279413 A1* | 9/2020 | Wheaton | G06T 5/003 |
| 2021/0118203 A1* | 4/2021 | Ding | G01R 33/5608 |

OTHER PUBLICATIONS

European Search Report for European Application No. 19188049.1—1010 dated Jan. 30, 2020.
Godino-Moya, Alejandro, et al. "Space-time variant weighted regularization in compressed sensing cardiac cine MRI." Magnetic resonance imaging 58 (2019): 44-55.
Robson, Philip M., et al. "Comprehensive quantification of signal-to-noise ratio and g-factor for image-based and k-space-based parallel imaging reconstructions." Magnetic Resonance in Medicine: An Official Journal of the International Society for Magnetic Resonance in Medicine 60.4 (2008): 895-907.

* cited by examiner

COMPRESSED SENSING WITH REGULARIZATION PARAMETER

The present patent document claims the benefit of European Patent Application No. 19188049.1, filed Jul. 24, 2019, which is hereby incorporated by reference.

TECHNICAL FIELD

The present disclosure relates to a method for generating a signal-to-noise improved magnetic resonance (MR) image of an object under examination and to the corresponding MR system. Furthermore, a computer program including program code and a carrier including the computer program are provided.

BACKGROUND

Compressed sensing (CS) is a method for accelerated MR signal acquisition based on an incomplete and random acquisition of the corresponding k-space. A signal-to-noise improved MR image is generated based on an iterative optimization process. The compressed sensing technology is carried out on the reconstruction side of the generated image and knowledge is used how signals may be compressed using the sparsity of the signals. This helps to reduce the sampling rate of the k-space and/or to reduce the signal-to-noise ratio of the reconstructed MR image.

The compressed sensing technology may be used in a variety of applications, (e.g., in the case of dynamic measurements of flow with a high temporal resolution). Here it is possible to obtain a fairly good image quality despite a high undersampling, as a high number of image pixels have low signal intensity. The expression "sparsity" reflects the fact that the extent of image pixels including meaningful data is low. By way of example, an angiographic MR image may be an intrinsically sparse image, as only the blood vessels include high signal intensity, whereas the remaining pixels show background without information.

Another field of application of the compressed sensing technology is a static application such as orthopedic applications where, e.g., in phase encoding direction an undersampling is carried out so that the complete acquisition time of the MR image may be reduced.

One important parameter in the compressed sensing technology is the regularization parameter $\lambda$. This regularization parameter describes the balance between the data consistency and the sparsity or the compressibility of the obtained MR images. The choice of the regularization parameter determines the amount of noise in the final image. If this parameter is selected with a too high value, the noise in the image is strongly reduced. However, this could mean that important relevant details of the shown anatomy were also lost. This is especially problematic where detailed structures have to be shown, such as in orthopedic images. If the regularization parameter is selected to be too low, the noise may cover the shown anatomy, so that it is not possible to correctly identify the anatomy in the noisy image.

When applying the compressed sensing technology, it has been found that, especially in orthopedic compressed sensing MR images, a high variability of the best regularization parameter has occurred. Accordingly, it was found that depending on the measurement setup the best regularization parameter is different from measurement to measurement, so that it is not possible to preselect a regularization parameter for different measurements in order to obtain a good result of the reconstructed image. In static measurements, the compressibility depends on the part of the body which is imaged and thus depends on the physiology and the parameters of the imaging protocol.

The same is true for dynamic measurements.

Accordingly, a need exists to improve the compressed sensing technology in such a way that the best regularization parameter is found for the different imaging situations.

Up to now, a lot of trial and error has been necessary to find the best regularization parameter which provides the best image quality, but which avoids that important information about the anatomy is lost.

SUMMARY AND DESCRIPTION

The scope of the present disclosure is defined solely by the appended claims and is not affected to any degree by the statements within this summary. The present embodiments may obviate one or more of the drawbacks or limitations in the related art.

According to a first aspect, a method for generating a signal-to-noise improved MR image of an object under examination is provided in an MR system using the compressed sensing technology. According to the method, a first MR signal data set of the object under examination is determined in which the corresponding k-space is randomly undersampled. Furthermore, a location dependent sensitivity map is determined for each of at least one receiving coil which is used to detect the MR signals of the first MR signal data set in the location where the object under examination is located. Furthermore, the signal-to-noise improved MR image is determined in an optimization process of the compressed sensing technology in which a location dependent regularization parameter is used, wherein this location dependent regularization parameter is determined based on the location dependent sensitivity map of the receiving coils.

With the use of the sensitivity maps of the receiving coils, the generation of the signal-to-noise improved MR image may be configured to the current measurement conditions which mainly depend on the receiving conditions of the receiving coils. The best or optimum regularization parameter depends on the signal-to-noise ratio of the image, and as the signal-to-noise ratio depends on the sensitivity map of the used receiving coils, a case-specific and location dependent regularization parameter may be determined. This case-specific and location dependent regularization parameter helps to improve the generated signal-to-noise improved MR image which is generated in the optimization process of the compressed sensing technology.

Furthermore, it is possible to determine a noise information at the location where the object under examination is located. The location dependent regularization parameter may then be determined based on the location dependent sensitivity maps of the involved coils and the determined noise. By way of example, the noise may be determined in the obtained MR images in the regions where no anatomy is shown, e.g., by using the standard deviation in a region of interest in a part of the image where no MR signal may be present. As an alternative, other methods for determining the noise might be used, such as a pseudo replica method as known from: "Comprehensive Quantification of Signal-to-Noise Ratio and g-Factor for Image-Based and k-Space-Based Parallel Imaging Reconstructions," Philip M. Robson, Magnetic Resonance in Medicine 60, pp. 895-907 (2008).

The location dependent regularization parameter may be a function which depends on the determined noise and the location dependent sensitivity map as variables.

The function may be determined such that the function is proportional to the noise and indirectly proportional to the location dependent sensitivity map. This means the higher the noise is, the higher the regularization parameter will be. Furthermore, the higher the sensitivity of the receiving coil in a certain region is, the lower the regularization parameter might be.

The location dependent sensitivity map may fully cover a predefined region of interest within a maximum possible field of view of the MR system. This predefined region of interest may be fully covered and does not include holes so that the location dependent regularization parameter is determined for the predefined region which does not include holes. The sensitivity maps generated for the receiving coils do not include holes, as it is determined based on the local coils and the body coil whether an MR signal may possibly come from a certain part within the maximum possible field of view of the MR system or whether no examined object is present at a certain location. Accordingly, with the use of the sensitivity maps, it is possible to obtain a regularization parameter for the complete area where MR signals may be theoretically detected by the MR system.

Furthermore, it is possible that the location dependent regularization parameter is averaged for a plurality of different locations in order to obtain a region dependent regularization parameter, wherein the same regularization parameter is used within one region. The signal-to-noise improved MR image is then determined based on the region dependent regularization parameter.

Accordingly, instead of using a regularization parameter which is different for each pixel of the image, the same regularization parameter may be used for different regions. The regions may be determined using region growing algorithms in which regularization parameters of different anatomical regions are combined and a single value is used within each of the regions. This further helps to improve the image quality, as the regularization parameter does not vary strongly from one pixel to a neighboring pixel.

The function of the location dependent regularization parameter may be as follows:

$$\lambda_f = af(E,R) - \lambda_0 \quad (1)$$

Here $\lambda_0$ is a constant predefined offset parameter; E is the local sensitivity map which depends on x, y, and z; R is the noise; and a is a scaling factor.

One possible option for the function is as follows:

$$f(E, R) = \exp\left(-b\frac{E}{R^2}\right) \quad (2)$$

A further option for the function is as follows:

$$f(E, R) = \begin{cases} \lambda_{max} \\ R/E & R_{min} > R > R_{max} \\ 0 \end{cases} \quad (3)$$

$R_{min}$ and $R_{max}$ are defined by the minimal and maximal required SNR=Signal/Noise, whereas the Signal is defined, e.g., by an average signal intensity. Examples for SNR would be a range of 5 to 100.

Furthermore, the corresponding MR system is provided. The MR system is configured to generate the signal-to-noise improved MR image of the object under examination. The MR system includes a control unit configured to operate as discussed above or as explained in further detail below.

Additionally, a computer program including program code is provided which, when executed by a control unit of the MR system, causes the MR system to perform a method as discussed above or as explained in further detail below.

Additionally, a carrier including the computer program is provided, wherein the carrier is one of an electronic signal, optical signal, radio signal, or a computer readable storage medium.

It should be understood that the features mentioned above and features yet to be explained below may be used not only in the respective combinations indicated, but also in other combinations without departing from the scope of the present application. Features of the above-mentioned aspects and embodiments described below may be combined with each other in other combinations, unless explicitly mentioned otherwise.

BRIEF DESCRIPTION OF THE DRAWINGS

The foregoing and additional features and effects of the application will become apparent from the following detailed description when read in conjunction with the accompanying drawings, in which like reference numerals refer to like elements.

DETAILED DESCRIPTION

Figure 1:
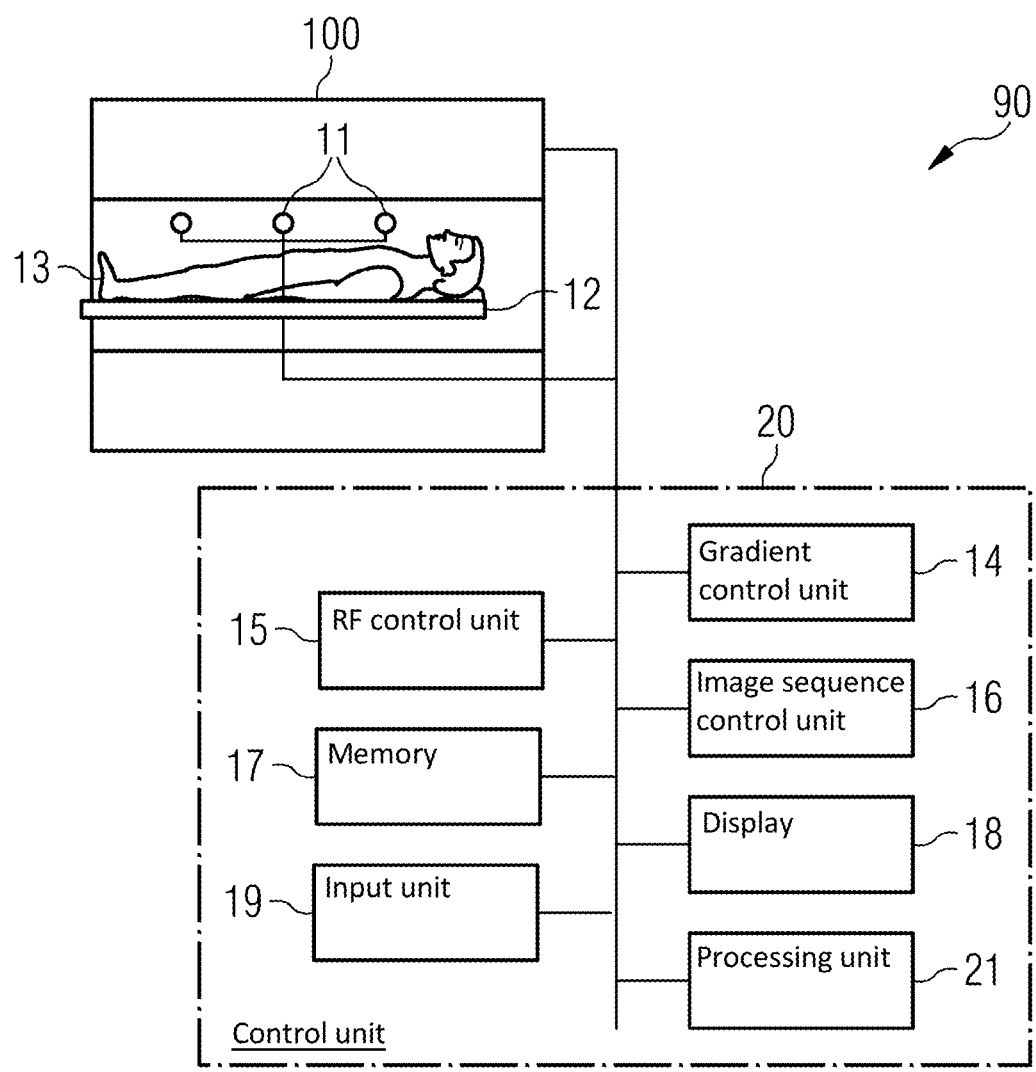
FIG. 1 depicts a schematic view of an example of a MR system configured to determine an MR image with an improved compressed sensing technology using sensitivity maps of the receiving coils.

In the following, embodiments of the disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are to be illustrative only.

The drawings are to be regarded as being schematic representations, and elements illustrated in the drawings are not necessarily shown to scale. Rather, the various elements are represented such that their function and general purpose becomes apparent to a person skilled in the art. Any connection or coupling between functional blocks, devices, components of physical or functional units shown in the drawings and described hereinafter may be implemented by an indirect connection or coupling. A coupling between components may be established over a wired or wireless connection. The functional blocks shown in the drawings may be implemented in hardware, software, firmware, or a combination thereof.

As will be explained below, the regularization parameter used in the compressed sensing technology is determined based on the sensitivity maps of the involved receiving coils receiving the MR signal which is used to generate the MR image which is processed using the compressed sensing technology.

FIG. 1 depicts a schematic view of an MR system 90 which is able to generate an MR image which has an improved signal-to-noise ratio which is generated based on the compressed sensing technology using a location dependent regularization parameter. The MR system 9 includes a magnet 100 generating the polarization field B0. The object under examination 13 lying on a table 12 is moved into the center of the MR system 90, where MR signals may be detected by receiving coils 11 after the magnetization is excited by RF excitation pulses. The receiving coils 11 may include different coil sections, wherein each coil section may be associated with a corresponding detection channel. Furthermore, a body coil (not shown) is provided, which is configured to apply RF pulses or receive MR signals from a maximum field of view that is possible in the MR system 90. By applying RF pulses and magnetic field gradients, the nuclear spins in the object 13, especially the part located in the receiving coil, are excited and location-coded, and the currents induced by the relaxation may be detected. The way how MR images are generated and how MR signals are detected using a sequence of RF pulses and a sequence of magnetic field gradients is known in the art, so that a detailed explanation thereof is omitted.

The MR system 90 includes a control unit 20 used for controlling the MR system. The control unit 20 includes a gradient control unit 14 for controlling and switching the magnetic field gradients, an RF control unit 15 for controlling and generating the RF pulses for the imaging sequence, and an image sequence control unit 16 configured to control the sequence of applied RF pulses and magnetic field gradients in dependence on the selected imaging sequence. In a memory 17, computer programs needed for operating the MR system 90 and the imaging sequences necessary for generating the MR images may be stored together with the generated MR images. The generated MR images may be displayed on a display 18, wherein an input unit or human-machine interface 19 is provided used by a user of the MR system to control the functioning of the MR system. A processing unit 21 including one or more processors which may carry out instructions stored in the memory 17 is provided. The memory may furthermore include a suitable program code to be executed by the processing unit 21. The processing unit may, based on the detected images, reconstruct MR images, especially based on the compressed sensing technology, as will be explained below.

Figure 2:
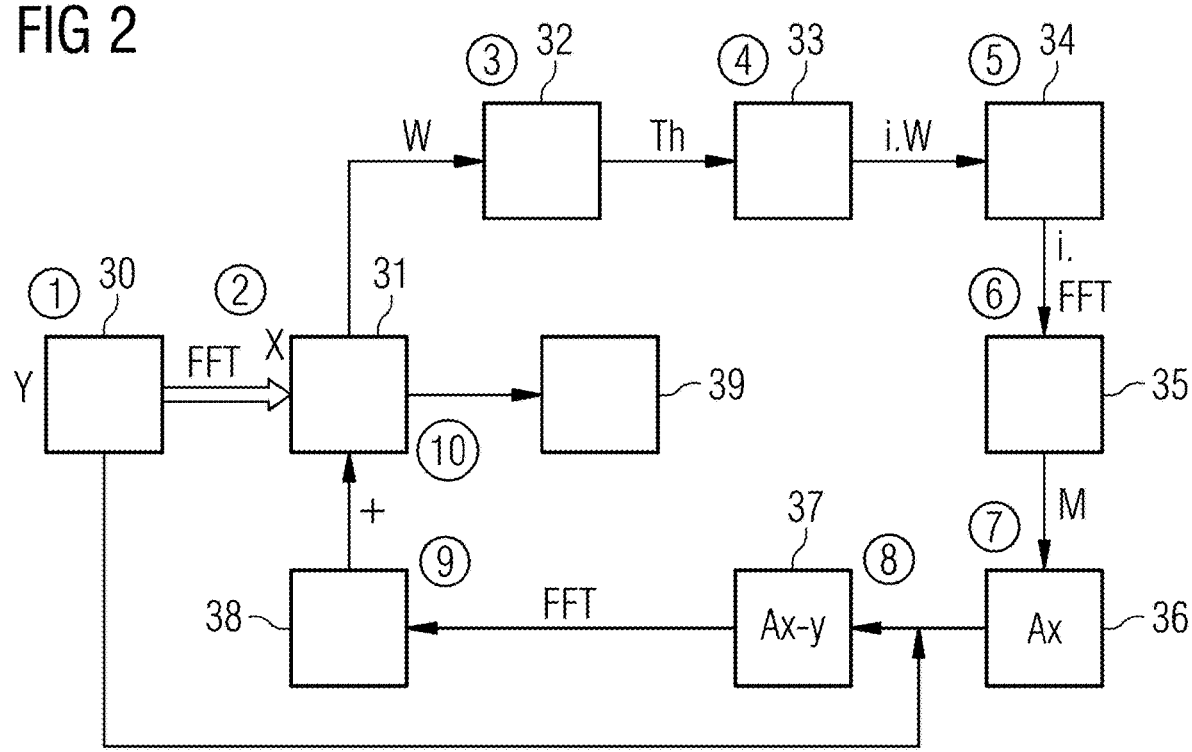
FIG. 2 depicts a schematic view of an example of a process how a signal-to-noise improved image is calculated based on a compressed sensing technology using sensitivity maps of the receiving coils.

FIG. 2 depicts a schematic view of the improved compressed sensing technology. The known three main components of the compressed sensing technology are first of all the incoherent, random undersampling of the k-space, the sparsity transform and the nonlinear iterative reconstruction. First of all, the first signal MR dataset 30 is generated where the k-space is acquired with an incoherent random undersampling. In the following an optimization process is carried out based on the following equation:

$$\min\|Ax-y\|_2^2 + \lambda\|Wx\|_1 \quad (4)$$

In this formula, y represents a clinical image 31 calculated form dataset 30 as acquired with the incoherent undersampling, x is the estimated image which is estimated based on the compressed sensing technology, and A is the transformation which includes two acts, an inverse Fourier transform and a trajectory masking, where only those pixels are depicted in k-space that were measured. The first term describes the data consistency and minimizes the least square difference, the L2 norm between the estimated image x and the acquired k-space data y. The smaller this difference term becomes, the better the consistency.

The second term describes the transform sparsity and is the L1 norm of the image transformed into the sparse representation, the W-space. Accordingly, w transforms the image space into the W-space. In this term, the sum of the absolute values of the pixels in the transform domain, denoted as L1 norm, is minimized. The smaller this L1 norm is, the higher the sparsity. $\lambda$ is the regularization parameter which is a weighting factor for balancing the data consistency versus sparsity.

Accordingly, the optimization procedure minimizes this equation and seeks to find a solution that fulfils both criteria, data consistency and transform sparsity. This is done in an iterative process as also shown in FIG. 2. First of all, the k-space dataset 30 is measured in k-space with a strong undersampling so that fewer MR signals are detected by the receiving coils than in a fully sampled MR image where the acquired signal data fulfil the Nyquist theorem.

As discussed above, an incoherent sampling is used and creates a noise-like appearance of the aliasing artifacts resulting from the undersampling. The reason is that these noise-like artifacts may then, in a later act of the algorithm, be removed with a thresholding procedure in W-space, as discussed in further detail below. The random character of the sampling is beneficial for the success of the compressed sensing technology. In act 1, this k-space data set 30 is Fourier transformed into image space so that an image 31 is obtained which is the image y including the noise-like artifacts as discussed above. This image suffers from strong undersampling artifacts, but the aliasing artifacts are smeared over the image due to the incoherence of the sampling. The better the incoherence of the acquired data, the more homogeneous the noise-like aliasing artifacts will appear and the better the reconstruction process will work.

This image 31 is used as a starting point for the iterative optimization. As only a small part of k-space was covered in the data set 30, the complete information about the image is not available. In act 2, the image x with reference numeral 31 was generated by a straightforward fast Fourier transform (FFT) and this image is only one possible solution that is consistent with the measured data, but this solution suffers from the artifacts. The following iterative process then serves to find a better artifact-free solution that is also consistent with the measured data y. In act 3, the image is then transformed into a sparse representation 32, into the W-space, this is a different basis such as a different mathematical depiction of the image. The goal of this transform is to locally separate the wanted signal from the noise artifacts. The W-space is a better suited depiction of the image, as the sparsity in W-space is higher. This means that the image information content is concentrated in a few pixels in the W-space while most of these pixels only have a very low signal. Different options exist for this W transform, one possible solution being a wavelet transform.

After the W transform, the wanted signal is now to a high degree separated from the noisy parts. This allows the removal of the noise by a thresholding procedure in which all the pixels with a value smaller than a threshold are set to zero and in which the threshold is subtracted from all the other pixel values so that dataset 33 is generated in act 4. This is also called soft thresholding. As many pixels in the W-space now have the value of zero, the number of non-zero pixels is lower. The transform sparsity, (e.g., the sparsity of the image in W-space), is increased.

Here, the regularization parameter as a threshold comes into play which determines how much signal is thrown away. A low value for regularization parameter leads to few pixels that are set to zero. A high regularization parameter, however, distorts the final image further in comparison to the original acquired.

The regularization parameter is now selected such that it is determined based on the sensitivity maps which are determined for the different receiving coils 11. The sensitivity maps may be determined during a prescan in which the MR system is configured to the present signal detection situation. In this prescan, the sensitivity maps of the different coil elements may be determined, as known in the art. The sensitivity is a measure of how each local receiving coil is receiving a signal. This sensitivity map is a three-dimensional map E (x, y, z). This map may be determined as part of the adjustment before the actual measurements are carried out. In the part of the image where no anatomy is provided, the noise R may be determined, e.g., by determining the standard deviation in a region of interest only covering non-signal parts in the image. As an alternative, the noise may be determined using a pseudo replica method similar to the iterative denoising method.

The regularization parameter may be then determined as follows:

$$\lambda_f = af(E,R) - \lambda_0 \qquad (1)$$

$\lambda_0$ is a constant offset which may depend on the imaging sequence and/or the part of the body present in the image, a is a scaling factor depending on the reconstruction, and f is a function which depends on the location dependent sensitivity map and the noise. The function may be determined such that it is proportional to the noise and indirectly proportional to the sensitivity map. In the following, two different examples of function are provided:

$$f(E, R) = \exp\left(-b\frac{E}{R^2}\right) \qquad (2)$$

$$f(E, R) = \begin{cases} \lambda_{max} \\ R/E \quad R_{min} > R > R_{max} \\ 0 \end{cases} \qquad (3)$$

The two functions above differ in their effect. In the first function, the exponential decay will not undergo a strong smoothing in small noise values, b is a scaling factor, and $R_{min}$ and $R_{max}$ are predefined noise values. Because the values for $R_{min}$ $R_{max}$ are absolute values that depend on settings like the power amplifier and scaling factors, explicit numbers are worthless. They may be chosen such that limits for $SNR_{max}$ and $SNR_{min}$ are not exceeded.

The second function has a linear weighting of the two variables, such as noise and sensitivity map, which are limited by two threshold values $R_{min}$ and $R_{max}$. Accordingly, a minimum and maximum denoising is obtained. Other functions may be used, such as a logarithmic limitation, in order to avoid a too high regularization.

The advantage of the use of the sensitivity maps in comparison to a global signal-to-noise ratio reference measurement is that a location dependent receiving sensitivity is obtained. Accordingly, it is possible to determine the regularization according to the sensitivity maps and dependent on the location. In a signal-to-noise ratio reference map, no information is available for the situation where no anatomy is present. The holes are avoided in the sensitivity maps, as a homogeneous receiving map of the large body coil is set in relation to the data obtained from the local receiving coils. Accordingly, when the local receiving coil indicates that it does not receive a signal from a certain part of the possible field of view, but if the whole body coil has a signal, it may be determined that it is a question of the receiving sensitivity of the local coil and that it is not due to the fact that there is no tissue emitting a signal in the corresponding location. Accordingly, a sensitivity map provides a complete overview over the receiving conditions of the presently imaged object.

Accordingly, a pixel-wise regularization is obtained. However, it is also possible to carry out a certain region growing in which the pixel- or voxel-wise regularization parameters are averaged for different connected areas. By way of example, in a homogeneous fat and water region including blood vessels, it is possible to assign an average region dependent regularization parameter to the different regions of the anatomy. The regions are separated by different intensity levels.

Referring again to FIG. 2 after thresholding with the threshold TH, a data set 33 is obtained in the W-space in which many pixels now have a value of zero, and only a few pixels have non-zero values. In act 5, the W-space representation is transformed back into the image space with the inverse W transform so that image 34 is obtained. By the thresholding procedure in the W-space, an image with less noise was obtained. This corresponds to a suppression of the noise-like aliasing artifacts. However, with this denoising the content of the image was also adapted, the image has less noise, but does not exactly reflect the measurement anymore. In the next three acts, the image consistency is thus checked in order to see how well the denoised image still represents the measurement data. In order to compare the denoised image 34 from act 5 with the k-space measurement 30, an inverse Fourier transform is applied to image 34 back into k-space, so that the data set 35 is obtained in act 6. This k-space now includes all the spatial frequencies so that a complete k-space is present in which all pixels in the k-space have non-zero values as opposed to the measured sub-sampled data set 30 in which only a few values had non-zero values.

Accordingly, in the following seventh act, a masking process is applied so that the k-space data set 35 is filtered such that only the points of k-space that were also measured in act 1 in data set 30 remain. The rest of the k-space is set to zero. After the masking with the measured trajectory, in act 7, the trajectory k-space Ax is obtained, the data set 36. In the following, in act 8, the difference in k-space is created by subtracting the k-space Ax from the measured k-space y so that a difference Ax-y is obtained which corresponds to the error, the non-consistency that the threshold from act 4 above has created compared to the measured k-space y. This difference is a correction k-space data set 37. In act 9, a simple Fourier transform converts the difference k-space into a difference image 38. This image is used as a correction for the update of the image that should be optimized.

In act 10, the image 31, the image x from act 2 is now updated by adding the correction difference image 38 obtained in act 9. This updated image now has less noise-like artifacts than the image before the update due to the acts 3 and 4. At the same time, it was made consistent with the measurement k-space from the first act by the correction from acts 8 and 9.

The process is repeated from acts 3-10, wherein the act numbers are shown in FIG. 2 by the encircled numbers. Acts 3 to 10 are now repeated, and each iteration will increase the sparsity in W-space corresponding to diminishing the aliasing artifacts in the image space. At the same time, the consistency of the reconstruction with the measured k-space is taken care of. The iteration is repeated until either the least square difference of the data consistency term is smaller than a threshold or a predefined number of iterations has been reached.

At the end, a signal-to-noise improved MR image 39 is obtained that is consistent with the measured data but is denoised due to the maximization of the transform sparsity.

The weighting factor λ for the balance between the transform sparsity versus data consistency and the threshold for the sparsification in W-space are related to each other in order to achieve optimal results. In the different measurements, different receiving coils may be used, such as a 4-channel receiving coil, a 16-channel receiving coil or a 12-channel body matrix coil. The regularization parameter depends on the signal-to-noise ratio and thus also depends on the sensitivity maps of the receiving coils.

With the above-described method, for each measurement the best regularization parameter may be determined automatically using the sensitivity maps of the receiving coils.

Figure 3:
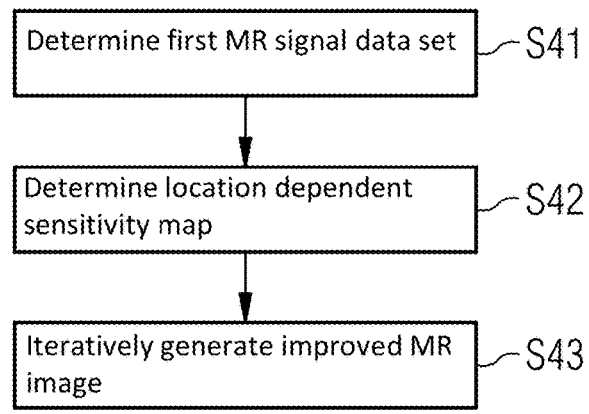
FIG. 3 depicts an example schematic flowchart of a message carried out by the MR system in order to determine an MR image based on the improved compressed sensing technology using the location dependent sensitivity maps of the receiving coils.

FIG. 3 summarizes some of the main acts carried out in the process. In act S41, the first MR signal data set, the data set 30, is determined in which the k-space is randomly subsampled. Furthermore, a location dependent sensitivity map is determined for each of the receiving coils used in the detection of the signal data set 30 (act S42). In act S43, the signal-to-noise improved MR image is determined using the location dependent regularization parameter which depends on the location dependent sensitivity maps of the different receiving coils. In act S43, the iterative process as discussed in connection with FIG. 2 in acts 3 to 10 is carried out and repeated until the signal-to-noise improved MR image 39 is obtained in the process of FIG. 2.

The above discussed solution has the advantage that different use cases may be handled more easily, as an improved regularization parameter is used which depends on the current measurement situation and the current receiving conditions. Furthermore, it is possible to use the already existing pre-scans and the sensitivity maps obtained in this context, so that the complete measurement time is not significantly increased.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for generating a signal-to-noise improved magnetic resonance (MR) image of an object under examination in an MR system using a compressed sensing technology, the method comprising:

determining a first MR signal data set of the object under examination in which a corresponding k-space is randomly subsampled;

determining a location dependent sensitivity map for each receiving coil of at least one receiving coil used to detect MR signals of the first MR signal data set in a location of the object under examination; and generating the MR image using an optimization process of the compressed sensing technology in which a location dependent regularization parameter is used, wherein the location dependent regularization parameter is determined based on the location dependent sensitivity map.

2. The method of claim 1, further comprising:

determining noise information in the location of the object under examination, wherein the location dependent regularization parameter is determined based on the location dependent sensitivity map and the determined noise information.

3. The method of claim 2, wherein the location dependent regularization parameter is a function depending on the determined noise information and the location dependent sensitivity map as variables.

4. The method of claim 3, wherein the location dependent regularization parameter is determined as follows:

$$\lambda_f = af(E,R) - \lambda_0$$

wherein:

$l_0$ is a constant predefined offset, f is a function,

E is the location dependent sensitivity map,

R is the noise information, and a is a scaling factor.

5. The method of claim 4, wherein the function is as follows:

$$f(E, R) = \exp\left(-b\frac{E}{R^2}\right).$$

6. The method of claim 4, wherein the function is as follows:

$$f(E, R) = \begin{cases} \lambda_{max} \\ R/E \quad R_{min} > R > R_{max} \\ 0 \end{cases}.$$

7. The method of claim 3, wherein the function is proportional to the determined noise information and inversely proportional to the location dependent sensitivity map.

8. The method of claim 1, wherein the location dependent sensitivity map fully covers a predefined region of interest within a maximum possible field of view of the MR system, wherein the predefined region of interest is fully covered and does not comprise holes, and wherein the location dependent regularization parameter is determined for the predefined region of interest.

9. The method of claim 1, wherein the location dependent regularization parameter is averaged for a plurality of different locations to a region dependent regularization parameter, wherein a single value of the region dependent regularization parameter is used within each location of the plurality of different locations, and wherein the MR image is generated based on the region dependent regularization parameter.

10. The method of claim 9, wherein the location dependent regularization parameter is determined as follows:

$$\lambda_f = af(E,R) - \lambda_0$$

wherein:
$\lambda_0$ is a constant predefined offset,
f is a function,
E is the location dependent sensitivity map,
R is the noise information, and
a is a scaling factor.

11. The method of claim 10, wherein the function is as follows:

$$f(E, R) = \exp\left(-b\frac{E}{R^2}\right).$$

12. The method of claim 10, wherein the function is as follows:

$$f(E, R) = \begin{cases} \lambda_{max} \\ R/E & R_{min} > R > R_{max} \\ 0 \end{cases}.$$

13. A magnetic resonance (MR) system configured to generate a signal-to-noise improved MR image of an object under examination in an MR system using a compressed sensing technology, the MR system comprising:
a control unit configured to:
determine a first MR signal data set of the object under examination in which a corresponding k-space is randomly subsampled;
determine a location dependent sensitivity map for each receiving coil of at least one receiving coil used to detect MR signals of the first MR signal data set in a location of object under examination; and
generate the MR image using an optimization process of the compressed sensing technology in which a location dependent regularization parameter is used,
wherein the location dependent regularization parameter is determined based on the location dependent sensitivity map.

14. The MR system of claim 13, wherein the control unit is further configured to:
determine noise information in the location of the object under examination,
wherein the location dependent regularization parameter is determined based on the location dependent sensitivity map and the determined noise information.

15. A non-transitory computer readable storage medium comprising a computer program having program code, wherein the computer program, when executed by a control unit of a magnetic resonance (MR) system, is configured to cause the MR system to:
determine a first MR signal data set of an object under examination in which a corresponding k-space is randomly subsampled;
determine a location dependent sensitivity map for each receiving coil of at least one receiving coil used to detect MR signals of the first MR signal data set in a location of object under examination; and
generate a MR image using an optimization process of a compressed sensing technology in which a location dependent regularization parameter is used,
wherein the location dependent regularization parameter is determined based on the location dependent sensitivity map.

* * * * *